United States Patent
Kameyama et al.

(10) Patent No.: US 9,793,266 B2
(45) Date of Patent: Oct. 17, 2017

(54) SEMICONDUCTOR DEVICE

(71) Applicant: TOYOTA JIDOSHA KABUSHIKI KAISHA, Toyota-shi, Aichi-ken (JP)

(72) Inventors: Satoru Kameyama, Toyota (JP); Shinya Iwasaki, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 15/318,091

(22) PCT Filed: May 18, 2015

(86) PCT No.: PCT/JP2015/064221
§ 371 (c)(1),
(2) Date: Dec. 12, 2016

(87) PCT Pub. No.: WO2016/009714
PCT Pub. Date: Jan. 21, 2016

(65) Prior Publication Data
US 2017/0141103 A1    May 18, 2017

(30) Foreign Application Priority Data
Jul. 14, 2014 (JP) ................. 2014-144283

(51) Int. Cl.
*H01L 27/06* (2006.01)
*H01L 29/739* (2006.01)
(Continued)

(52) U.S. Cl.
CPC ...... *H01L 27/0664* (2013.01); *H01L 29/0696* (2013.01); *H01L 29/1095* (2013.01); *H01L 29/7397* (2013.01); *H01L 29/861* (2013.01)

(58) Field of Classification Search
CPC ............. H01L 27/0664; H01L 29/0696; H01L 29/1095; H01L 29/7395; H01L 29/7397; H01L 29/66348; H01L 29/861
See application file for complete search history.

(56) References Cited

U.S. PATENT DOCUMENTS

| | | | | |
|---|---|---|---|---|
| 6,140,678 A * | 10/2000 | Grabowski | ......... | H01L 27/0255 257/328 |
| 2005/0035398 A1* | 2/2005 | Williams | ............ | H01L 29/7827 257/329 |

(Continued)

FOREIGN PATENT DOCUMENTS

| JP | 2010-171385 A | 8/2010 |
|---|---|---|
| WO | 2013/030943 A1 | 3/2013 |

(Continued)

*Primary Examiner* — Tucker J Wright
(74) *Attorney, Agent, or Firm* — Oliff PLC (57) ABSTRACT

An influence of a gate interference is suppressed and a reverse recovery property of a diode is improved. A diode includes a diode region located between the first boundary trench and the second boundary trench and a first and second IGBT regions. An emitter region and a body region are provided in each of the first and second IGBT regions. Each body region includes a body contact portion. An anode region is provided in the diode region. The anode region includes an anode contact portion. An interval between the first and second boundary trenches is equal to or longer than 200 μm. An area ratio of the anode contact portion in the diode region is lower than each of an area ratio of the body contact portion in the first IGBT region and an area ratio of the body contact portion in the second IGBT region.

7 Claims, 6 Drawing Sheets

(51) Int. Cl.
  *H01L 29/10* (2006.01)
  *H01L 29/06* (2006.01)
  *H01L 29/861* (2006.01)

(56) References Cited

U.S. PATENT DOCUMENTS

| | | |
|---|---|---|
| 2008/0048295 A1 | 2/2008 | Takahashi |
| 2009/0072339 A1 | 3/2009 | Tsuzuki et al. |
| 2010/0156506 A1 | 6/2010 | Tsuzuki et al. |
| 2013/0248882 A1 | 9/2013 | Ogura et al. |
| 2014/0217465 A1 | 8/2014 | Soeno |
| 2015/0008478 A1 | 1/2015 | Cheng et al. |
| 2015/0295042 A1 | 10/2015 | Kameyama et al. |

FOREIGN PATENT DOCUMENTS

| | | |
|---|---|---|
| WO | 2013/111568 A1 | 8/2013 |
| WO | 2014/097454 A1 | 6/2014 |

* cited by examiner

SEMICONDUCTOR DEVICE

TECHNICAL FIELD

This application claims priority to Japanese Patent Application No. 2014-144283 filed on Jul. 14, 2014, the contents of which are hereby incorporated by reference into the present application.

A technology disclosed herein relates to semiconductor devices.

BACKGROUND ART

International Publication WO/2013/030943 A1 (hereinbelow referred to as Patent Document 1) discloses a semiconductor device in which a diode and an IGBT are provided in a single semiconductor substrate (a so-called RC-IGBT).

SUMMARY

Technical Problem

In an RC-IGBT, holes flow into a drift region of a diode from a body region of an IGBT adjacent to the diode upon when the diode is electrically conducted. Since these holes contribute to a current of the diode, a forward voltage of the diode drops when the holes flow. Further, when an on-voltage is applied to a gate of the IGBT during the electric conduction of the diode, a number of the holes flowing into the drift region of the diode from the body region of the IGBT decreases. Due to this, the forward voltage of the diode rises. Hereinbelow, a phenomenon in which the forward voltage of the diode changes according to a voltage of a gate electrode of the IGBT will be termed a gate interference. The gate interference becomes problematic in that it causes a forward voltage property of the diode to become instable.

Patent Document 1 discloses a technology that configures a contact portion of the body region of the IGBT (a portion the electrically connects to an electrode) smaller than a contact portion of an anode region of the diode to suppress the gate interference. According to this configuration, the holes flowing into the drift region of the diode from the body region of the IGBT decreases, so an influence of the gate interference can be mitigated. However, according to this configuration, since the contact portion of the anode region is large, the holes flow in a high density into the drift region from the anode region upon operating the diode, so a hole density in the drift region becomes high. Due to this, a reverse recovery property of the diode would be deteriorated. That is, when an applied voltage of the diode, to which a forward voltage is being currently applied, is switched to a reverse voltage, the holes existing in the drift region of the diode are discharged into an anode electrode, and a reverse current flows momentarily in the diode. If the density of the holes existing in the drift region during the forward voltage application is high, a current density of the holes discharged to the anode electrode upon the reverse voltage application also becomes high. As a result, a response speed of the diode is slowed down. Thus, in this description, a semiconductor device with fast response speed for a diode and with small influence from a gate interference is to be provided.

Solution to Technical Problem

A semiconductor device disclosed herein comprises: a semiconductor substrate; a front surface electrode provided on a front surface of the semiconductor substrate; and a rear surface electrode provided on a rear surface of the semiconductor substrate. A first boundary trench, a first trench, a second boundary trench, and a second trench are provided in the front surface. The first trench extends along the first boundary trench. The second boundary trench is provided on a side opposite to the first trench with the first boundary trench interposed in between the second boundary trench and the first trench, and extends along the first boundary trench. The second trench is provided on a side opposite to the first boundary trench with the second boundary trench interposed in between the second trench and the first boundary trench, and extends along the first boundary trench. The semiconductor substrate comprises a first IGBT region, a diode region, and a second IGBT region. The first IGBT region is located between the first trench and the first boundary trench. The diode region is located between the first boundary trench and the second boundary trench. The second IGBT region is located between the second trench and the second boundary trench. A gate insulating film and a gate electrode insulated from the semiconductor substrate by the gate insulating film are provided in each of the first trench and the second trench. An interlayer insulating film is each provided between each of the gate electrodes and the front surface electrode. An insulating layer is provided in each of the first boundary trench and the second boundary trench. An emitter region and a body region are provided in each of the first IGBT region and the second IGBT region. Each of the emitter regions is of n-type and in contact with the front surface electrode and the corresponding gate insulating film. Each of the body regions is of p-type, in contact with the front surface electrode, and in contact with the corresponding gate insulating film on a rear surface side of the emitter region. Each of the body regions comprises a body contact portion being in contact with the front surface electrode and having a p-type impurity density equal to or higher than $1 \times 10^{18}$ atoms/cm$^3$ at the front surface. An anode region of p-type being in contact with the front surface electrode is provided in the diode region. The anode region comprises an anode contact portion being in contact with the front surface electrode and having a p-type impurity density equal to or higher than $1 \times 10^{18}$ atoms/cm$^3$ at the front surface. An n-type region extending across the first IGBT region, the second IGBT region and the diode region is provided in a region located on rear surface sides of the anode region and each of the body regions. The n-type region is in contact with the rear surface electrode in at least a part of the diode region. A collector region of p-type being in contact with the rear surface electrode is provided each of at least a part of a region located on a rear surface side of the n-type region in the first IGBT region and at least a part of a region located on a rear surface side of the n-type region in the second IGBT region. An interval between the first boundary trench and the second boundary trench is equal to or longer than 200 μm. An area ratio of the anode contact portion occupying the front surface in the diode region is lower than each of an area ratio of the body contact portion occupying the front surface in the first IGBT region and an area ratio of the body contact portion occupying the front surface in the second IGBT region.

Notably, in this description, an area ratio of a particular portion occupying a particular front surface refers to a value obtained by dividing an area of the particular portion by an area of the particular front surface. For example, "an area ratio of the anode contact portion occupying the front surface of the diode region" refers to a value obtained by dividing an area of the anode contact portion by an area of the front surface in the diode region. Further, "an interval between the first boundary trench and the second boundary trench" refers to a distance between a center line of the first boundary trench and a center line of the second boundary trench in a case of viewing the front surface of the semiconductor substrate in a plan view.

Accordingly, by making the interval between the first boundary trench and the second boundary trench (that is, a width of the diode region) wide, by being 200 μm or greater, a number of holes flowing into the drift region from the anode region upon electric conduction of the diode increases. Further, the holes that flow into the drift region from the body region upon the electric conduction of the diode flow only in a vicinity of a boundary between the IGBT region and the diode region, thus they would not be increased from widening the width of the diode region. Thus, by widening the width of the diode region, a ratio of the holes flowing through the anode region to the holes flowing through the body region can be reduced. Due to this, an influence of the holes flowing through the body region (that is, the holes of which flow rate is affected by the gate interference) is reduced, and the forward voltage of the diode is stabilized. Further, by making the area ratio of the contact portion of the anode region small as compared to the contact portion of the body region, a hole density in the drift region can be prevented from becoming excessively increased by the holes supplied from the anode region to the drift region upon operation of the diode. Due to this, a reverse recovery property of the diode can be improved.

DETAILED DESCRIPTION

Initially, some features of embodiments will be listed. Notably, each of the features below has utility independently.

(Feature 1)

A plurality of third trenches extending along the first boundary trench may be provided in the front surface in the diode region. The anode region comprising the anode contact portion may be provided in each of diode cell regions, and each of the diode cell regions may be interposed in between any two of the third trenches in the diode region, the first boundary trench, and the second boundary trench.

(Feature 2)

A plurality of fourth trenches extending along the first boundary trench may be provided in each of the first IGBT region and the second IGBT region. The gate insulating film and the gate electrode may be provided in each of the fourth trenches. The emitter region and the body region comprising the body contact portion may be provided in each of IGBT cell regions, and each of the IGBT cell regions may be interposed in between any two of the fourth trenches, the first boundary trench, and the second boundary trench.

(Feature 3)

In each of the diode cell regions, an area ratio of the anode contact portion occupying the front surface in the diode cell region may be lower than each of area ratios of the body contact portions occupying the front surface in the IGBT cell regions.

(Feature 4)

Each of the anode contact portions may extend along the third trenches.

(Feature 5)

Each of the diode cell regions may comprise a plurality of the anode contact portions separated from each other. The plurality of the anode contact portions may be arranged along the third trenches in each of the diode cell regions.

(Feature 6)

Each of the anode contact portions provided in the diode cell region adjacent to the first boundary trench may be arranged at a position in a width direction of the first boundary trench as seen from the emitter region provided in the IGBT cell region adjacent to the first boundary trench.

First Embodiment

Figure 1:
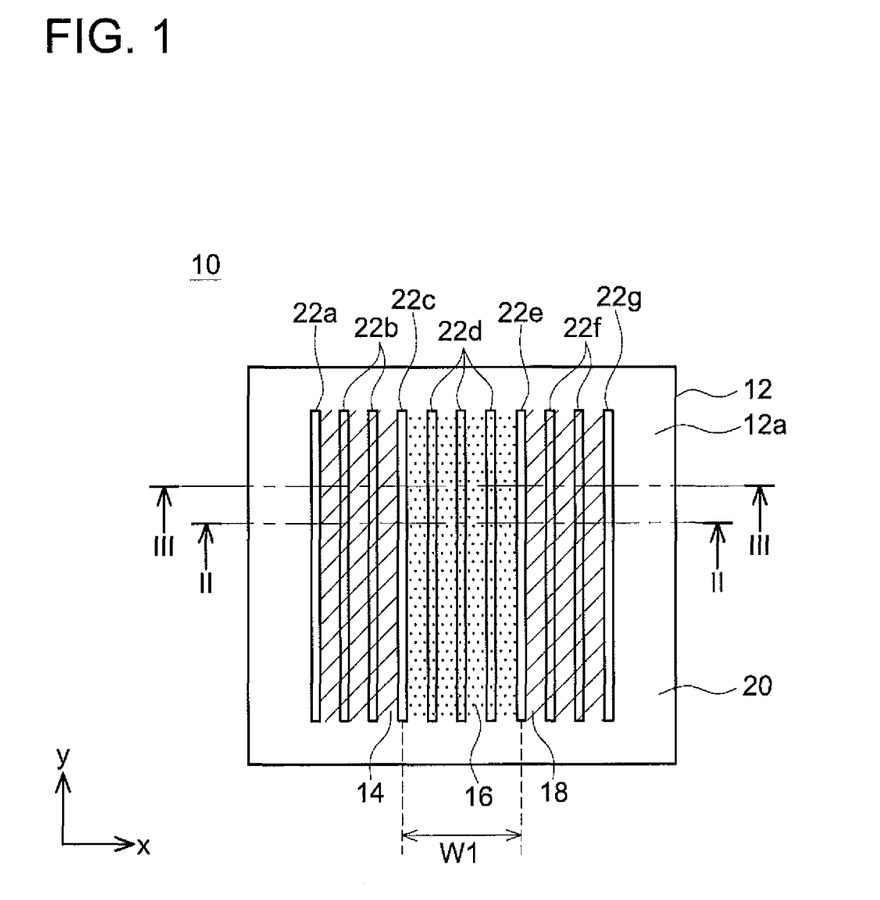
FIG. 1 is a plan view of a semiconductor device 10.

A semiconductor device 10 shown in FIG. 1 comprises a semiconductor substrate 12 made of silicon. Notably in FIG. 1, depiction of electrodes and insulating layers provided on a front surface (surface) 12a of the semiconductor substrate 12 is omitted. As shown in FIG. 1, a plurality of trenches 22 is provided on the front surface 12a of the semiconductor substrate 12. The plurality of trenches 22 extends parallel to each other in a plan view of the front surface 12a. Hereinbelow, a long direction of the trenches 22 in FIG. 1 will be termed a y direction, and a direction perpendicularly intersecting the y direction in FIG. 1 will be termed an x direction.

The semiconductor substrate 12 can be partitioned into a first IGBT region 14, a diode region 16, a second IGBT region 18, and a peripheral region 20 in the plan view of the front surface 12a. Notably, in FIG. 1, the first IGBT region 14 and the second IGBT region 18 are indicated by oblique hatched lines, and the diode region 16 is indicated by dotted hatched lines. Although this will be described in detail later, IGBTs are provided in the first IGBT region 14 and the second IGBT region 18, and a diode is provided in the diode region 16.

The first IGBT region 14 is provided between a trench 22a and a trench 22c among the plurality of trenches 22. More specifically, the first IGBT region 14 is a region surrounded by the trench 22a, the trench 22c, and straight lines connecting both ends of the trench 22a and the trench 22c in the plan view of the front surface 12a. Part of the trenches (plurality of trenches 22b) among the plurality of trenches 22 is provided on the front surface 12a in the first IGBT region 14.

The second IGBT region 18 is provided between a trench 22e and a trench 22g among the plurality of trenches 22. More specifically, the second IGBT region 18 is a region surrounded by the trench 22e, the trench 22g, and straight lines connecting both ends of the trench 22e and the trench 22g in the plan view of the front surface 12a. Part of the trenches (plurality of trenches 22f) among the plurality of trenches 22 is provided on the front surface 12a in the second IGBT region 18.

The diode region 16 is provided between the trench 22c and the trench 22e among the plurality of trenches 22. More specifically, the diode region 16 is a region surrounded by the trench 22c, the trench 22e, and straight lines connecting both ends of the trench 22c and the trench 22e in the plan view of the front surface 12a. The diode region 16 is arranged between the first IGBT region 14 and the second IGBT region 18. Part of the trenches (plurality of trenches 22d) among the plurality of trenches 22 is provided on the front surface 12a in the diode region 16.

The peripheral region 20 is a region in a vicinity of a peripheral end of the semiconductor substrate 12. The peripheral region 20 is provided around the first IGBT region 14, the diode region 16, and the second IGBT region 18.

Figure 2:
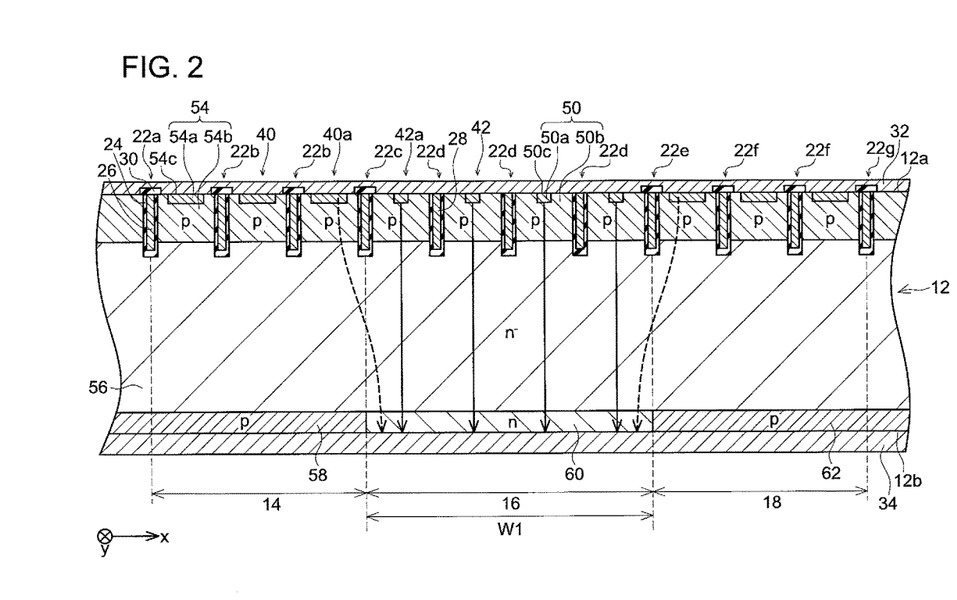
FIG. 2 is a vertical cross sectional view along a line II-II in FIG. 1.
Figure 3:
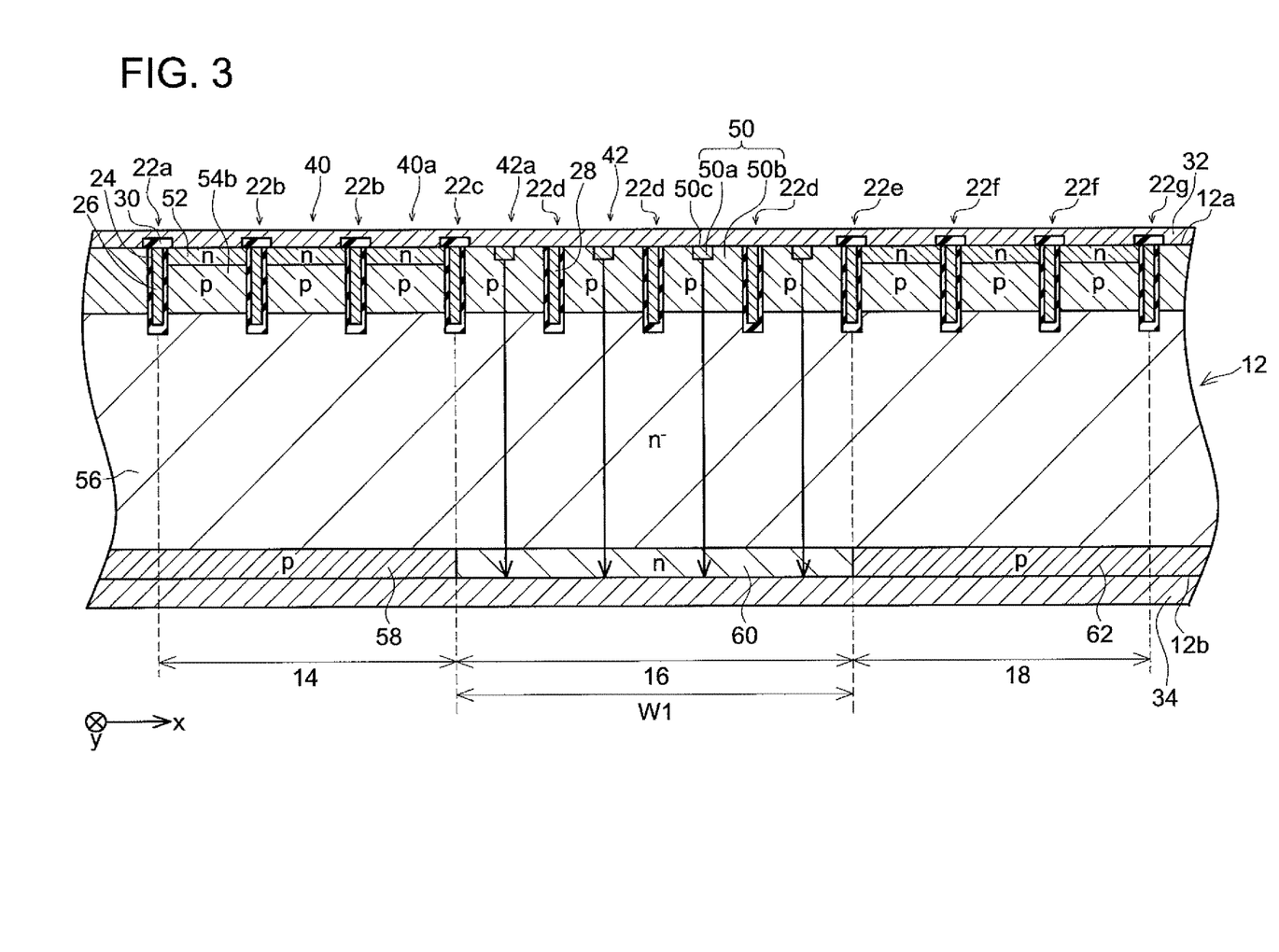
FIG. 3 is a vertical cross sectional view along a line III-III in FIG. 1.

As shown in FIGS. 2 and 3, each of the trenches 22 (that is, the trenches 22a to 22g) extends in a thickness direction of the semiconductor substrate 12 from the front surface 12a of the semiconductor substrate 12. An insulating film 24 is provided inside each trench 22. The insulating film 24 covers bottom and side surfaces of each trench 22. Each of the trenches 22a, 22b, 22c, 22e, 22f, and 22g has a gate electrode 26 arranged therein. Each gate electrode 26 is insulated from the semiconductor substrate 12 by its insulating film 24. A control electrode 28 is arranged in each trench 22d. Each control electrode 28 is insulated from the semiconductor substrate 12 by its insulating film 24. Each gate electrode 26 is connected to a gate pad with a wiring that is not shown. Potentials of the gate electrodes 26 are configured to be controllable independent from potentials of the control electrodes 28. The control electrodes 28 are connected to an emitter electrode 32. An upper surface of each gate electrode 26 is covered by an interlayer insulating film 30. Notably, hereinbelow, within semiconductor regions in the first IGBT region 14 and the second IGBT region 18, a semiconductor region interposed between two trenches 22 will be termed a cell region 40. Further, hereinbelow, within a semiconductor region in the diode region 16, a semiconductor region interposed between two trenches 22 will be termed a cell region 42.

As shown in FIGS. 2 and 3, a front surface electrode 32 made of aluminum is provided on the front surface 12a of the semiconductor substrate 12. The front surface electrode 32 is insulated from the respective gate electrodes 26 and the respective control electrodes 28 by the interlayer insulating films 30. A rear surface electrode 34 made of aluminum is provided on the rear surface 12b of the semiconductor substrate 12.

Figure 4:
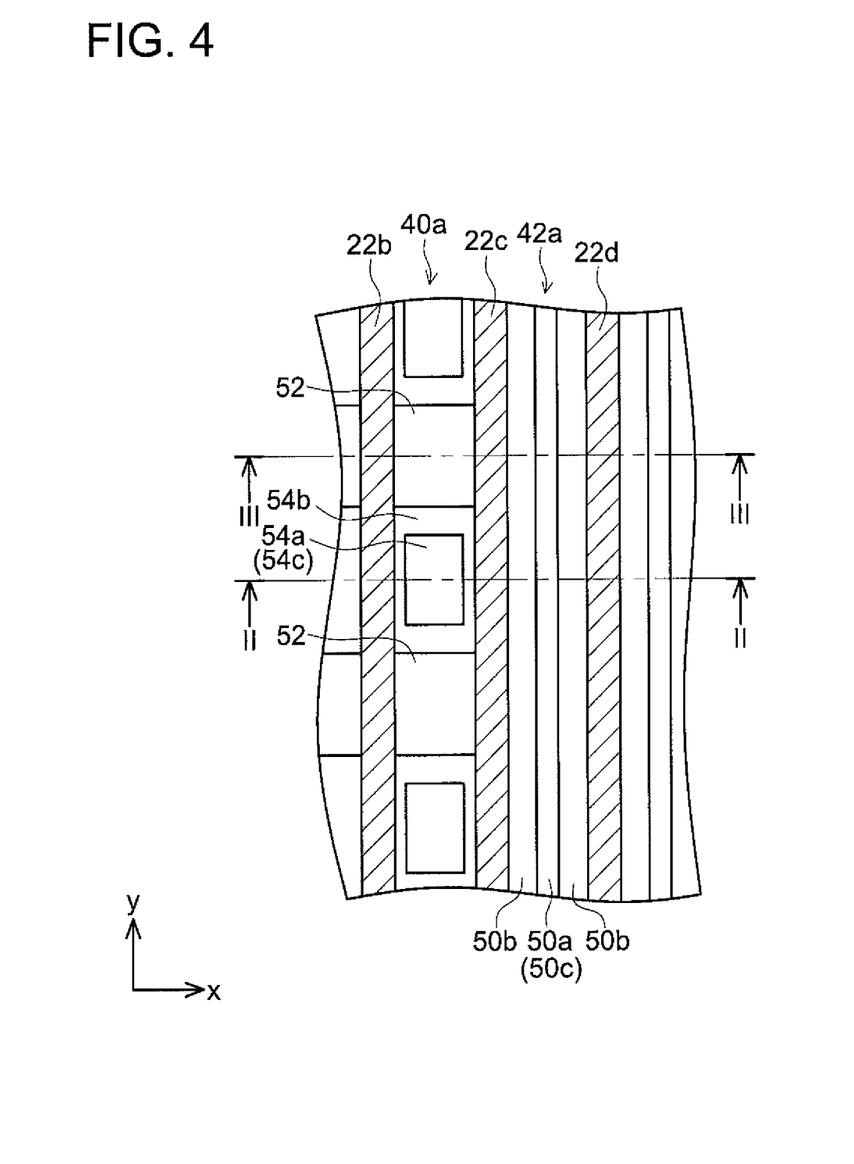
FIG. 4 is an enlarged plan view of the semiconductor substrate 10 near a trench 22c.

FIG. 4 indicates the front surface 12a in the cell regions 40, 42 in a vicinity of the trench 22c. Notably, in FIG. 4, the trenches 22 are indicated by oblique hatching lines for easier view. Hereinbelow, the cell region 40 adjacent to the trench 22c will be termed a cell region 40a, and the cell region 42 adjacent to the trench 22c will be termed a cell region 42a.

As shown in FIGS. 2 to 4, the cell region 42a is provided with a p-type anode region 50. The anode region 50 is exposed on the front surface 12a of the semiconductor substrate 12. The anode region 50 expands from the front surface 12a to a position that is shallower than lower ends of the gate electrodes 26 and lower ends of the control electrodes 28 (a position on a front surface 12a side). The anode region 50 includes a high density region 50a having a p-type impurity density of $1 \times 10^{18}$ atoms/cm$^3$ or greater, and a low density region 50b having a p-type impurity density that is less than $1 \times 10^{18}$ atoms/cm$^3$. The high density region 50a is provided only in a vicinity of the front surface 12a. The high density region 50a is provided at a center portion of the cell region 42a in the x direction. The high density region 50a is exposed on the front surface 12a. The high density region 50a elongates in the y direction along the trenches 22. The low density region 50b is exposed on the front surface 12a on both sides of the high density region 50a. The low density region 50b is also provided under the high density region 50a. The high density region 50a and the low density region 50b make contact with the front surface electrode 32 at the front surface 12a. Since the p-type impurity density of the high density region 50a is high, a barrier that is present between the high density region 50a and the front surface electrode 32 is small. That is, the high density region 50a forms an ohmic contact with the front surface electrode 32. Hereinbelow, a contact surface between the high density region 50a and the front surface electrode 32 will be termed a contact portion 50c. As shown in FIG. 4, the contact portion 50c elongates in the y direction along the trenches 22. On the other hand, since the p-type impurity density of the low density region 50b is low, a high barrier is present between the low density region 50b and the front surface electrode 32. That is, the low density region 50b forms a Schottky connection with the front surface electrode 32.

Each of the cell regions 42 has identical structure as the aforementioned cell region 42a. Notably, each cell region 42 does not have an n-type region contacting the front surface electrode 32 and the insulating films 24, as emitter regions 52 (to be described later) do. In other words, a region where the n-type region contacting the front surface electrode 32 and the insulating films 24 is not provided within the region interposed between the trenches 22 corresponds to the diode region 16. Notably, in the first embodiment, the n-type region is not provided within the anode regions 50, however, an n-type region other than the n-type region contacting the front surface electrode 32 and the insulating films 24 may be provided within the anode regions 50. For example, an n-type region that makes contact with the insulating films 24 but does not make contact with the front surface electrode 32 may be provided within the anode regions 50.

As shown in FIGS. 2 to 4, the cell region 40a includes emitter regions 52 and a body region 54.

The emitter regions 52 are of an n-type, and are exposed on the front surface 12a of the semiconductor substrate 12. The emitter regions 52 are provided only in the vicinity of the front surface 12a. A plurality of emitter regions 52 is provided within the cell region 40a with intervals in the y direction in between them. The emitter regions 52 make contact with the front surface electrode 32 at the front surface 12a. Since an n-type impurity density of the emitter regions 52 is high, barriers present between the emitter regions 52 and the front surface electrode 32 are small. That is, the emitter regions 52 form ohmic contacts with the front surface electrode 32. Further, the emitter regions 52 make contact with the insulating films 24 within the trenches 22 on both sides of the cell region 40a.

The body region 54 is of a p-type, and is exposed on the front surface 12a at positions where the emitter regions 52 are not provided. The body region 54 expands from the front surface 12a to a position shallower than the lower ends of the gate electrodes 26 and the lower ends of the control electrodes 28. The body region 54 makes contact with the insulating films 24 within the trenches 22 on both sides of the cell region 40a. The body region 54 is provided also under the emitter regions 52. The body region 54 makes contact with the insulating films 24 within the trenches 22 on both sides of the cell region 40a under the emitter regions 52.

The body region 54 includes high density regions 54a having a p-type impurity density of $1 \times 10^{18}$ atoms/cm$^3$ or greater, and a low density region 54b having a p-type impurity density that is less than $1 \times 10^{18}$ atoms/cm$^3$. The high density regions 54a are provided only in the vicinity of the front surface 12a. The high density regions 54a are exposed on the front surface 12a. The low density region 54b is exposed on the front surface 12a at sides of each high density region 54a. Further, the body region 54 located on a rear surface 12b side than the emitter regions 52 and the high density region 54a is the low density region 54b. Since the p-type impurity density of the high density regions 54a is high, barriers that are present between the high density regions 54a and the front surface electrode 32 are small. That is, the high density regions 54a form ohmic contacts with the front surface electrode 32. Hereinbelow, contact surfaces between the high density regions 54a and the front surface electrode 32 will be termed contact portions 54c. Since the p-type impurity density of the low density region 54b is low, a high barrier is present between the low density region 54b and the front surface electrode 32. That is, the low density region 54b forms a Schottky contact with the front surface electrode 32.

Notably, the high density regions 54a of the body region 54 and the high density regions 50a of the anode regions 50 are formed simultaneously by p-type ion implantation. Due to this, the p-type impurity density of the high density regions 54a is substantially equal to the p-type impurity density of the high density regions 50a. Further, a depth of the high density regions 54a is substantially equal to a depth of the high density regions 50a.

Each cell region 40 has an identical structure as the aforementioned cell region 40a. In each cell region 40a, positions of the emitter regions 52 and the body region 54 in the y direction are equal. Thus, when the front surface 12a is seen in the plan view, the emitter regions 52 and the body region 54 are recognized as extending in the x direction across the trenches 22.

An n-type drift region 56 is provided in a region on the rear surface 12b side of the anode regions 50 and the body region 54. An n-type impurity density of the drift region 56 is low. The drift region 56 extends across the first IGBT region 14, the diode region 16, and the second IGBT region 18. That is, the drift region 56 is continuous over the first IGBT region 14, the diode region 16, and the second IGBT region 18. The drift region 56 is separated from the emitter regions 52 by the body region 54. The drift region 56 is in contact with the anode regions 50 and the body region 54. Further, the drift region 56 is in contact with the insulating films 24 in vicinities of the lower ends of the respective trenches 22. Thus, each of the gate electrodes 26 and the control electrodes 28 faces the emitter region 52, the body region 54, and the drift region 56 via its insulating film 24.

An n-type cathode region 60 is provided in a region on the rear surface 12b side of the drift region 56 in the diode region 16. The cathode region 60 has a higher n-type impurity density than the drift region 56. The cathode region 60 is in contact with the drift region 56. The cathode region 60 is exposed on the rear surface 12b. The cathode region 60 is in contact with the rear surface electrode 34 at the rear surface 12b. The cathode region 60 is in an ohmic contact with the rear surface electrode 34.

A p-type collector region 58 is provided in a region on the rear surface 12b side of the drift region 56 in the first IGBT region 14. The collector region 58 is in contact with the drift region 56. The collector region 58 is exposed on the rear surface 12b. The collector region 58 is in contact with the rear surface electrode 34 at the rear surface 12b. The collector region 58 is in an ohmic contact with the rear surface electrode 34.

A p-type collector region 62 is provided in a region on the rear surface 12b side of the drift region 56 in the second IGBT region 18. The collector region 62 is in contact with the drift region 56. The collector region 62 is exposed on the rear surface 12b. The collector region 62 is in contact with the rear surface electrode 34 at the rear surface 12b. The collector region 62 is in an ohmic contact with the rear surface electrode 34.

A diode is provided in the diode region 16 by the anode region 50, the drift region 56, and the cathode region 60. IGBTs are provided in the first IGBT region 14 and the second IGBT region 18 by the emitter regions 52, the body regions 54, the drift region 56, the collector regions 58, the gate electrodes 26, and the insulating films 24.

An interval W1 shown in FIGS. 1 to 3 indicates an interval between the trench 22c and the trench 22e. More specifically, the interval W1 indicates the interval between a center line of the trench 22c and a center line of the trench 22e when the front surface 12a is seen in the plan view. The interval W1 indicates a width of the diode region 16. The interval W1 is 200 μm or greater.

Next, contact area ratios of the respective regions will be described. A contact area ratio refers to a ratio by which a contact portion occupies in a specific region. Hereinbelow, an area of each cell region 42 (that is, the semiconductor region in the diode region 16 interposed between two trenches 22) on the front surface 12a will be termed S1, an area of contact portion 50c in each cell region 42 will be termed S2, an area of each cell region 40 (that is, the semiconductor region interposed between two trenches 22 in the IGBT regions 14, 18) on the front surface 12a will be twined S3, and an area of the contact portion 54c in each cell region 40 will be termed S4. Further, an area of the first IGBT region 14 on the front surface 12a will be termed SI1, an Area of the Diode Region 16 on the Front Surface 12a Will be Termed Sd, and an area of the second IGBT region 18 on the front surface 12a will be termed SI2. Further, a total area of the contact portions 54c in the first IGBT region 14 will be termed $\Sigma S2_{-1}$, a total area of the contact portions 54c in the second IGBT region 18 will be termed $\Sigma S2_{-2}$, and a total area of the contact portions 50c in the diode region 16 will be termed $\Sigma S4$.

The contact area ratio of the cell region 42 is S2/S1, and the contact area ratio of the cell regions 40 is S4/S3. The contact area ratio S2/S1 may vary among the cell regions 42 due to error and the like, however, the contact area ratios S2/S1 of the cell regions 42 are substantially equal to each other. Further, although the contact area ratio S4/S3 may vary among the cell regions 40 due to error and the like, the contact area ratios S4/S3 of the cell regions 40 are substantially equal to each other. In the semiconductor device 10, S2/S1<S4/S3 is satisfied. That is, the contact area ratio S2/S1 of each cell region 42 is lower than each of the contact area ratios S4/S3 of the cell regions 40.

Further, the contact area ratio of the first IGBT region 14 is $\Sigma S2_{-1}/SI1$. The contact area ratio of the second IGBT region 18 is $\Sigma S2_{-2}/SI2$. Since S2/S1<S4/S3 is satisfied, S2/S1<$\Sigma S2_{-1}/SI1$ is satisfied in the semiconductor device 10 as well as S2/S1<$\Sigma S2_{-2}/SI2$ is satisfied. That is, the contact area ratio S2/S1 of each cell region 42 is lower than each of the contact area ratio $\Sigma S2_{-1}/SI1$ of the first IGBT region 14 and the contact area ratio $\Sigma S2_{-2}/SI2$ of the second IGBT region 18. Further, the contact area ratio of the diode region 16 is $\Sigma S4/Sd$. Since S2/S1<S4/S3 is satisfied, $\Sigma S4/Sd$<$\Sigma S2_{-1}/SI1$ is satisfied in the semiconductor device 10 as well as $\Sigma S4/Sd$<$\Sigma S2_{-2}/SI2$ is satisfied. That is, the contact area ratio $\Sigma S4/Sd$ of the diode region 16 is lower than each of the contact area ratio $\Sigma S2_{-1}/SI1$ of the first IGBT region 14 and the contact area ratio $\Sigma S2_{-2}/SI2$ of the second IGBT region 18. Further, in the semiconductor device 10, $\Sigma S4/Sd < S4/S3$ is also satisfied. That is, the contact area ratio $\Sigma S4/Sd$ of the diode region 16 is lower than each of the contact area ratios S4/S3 of the cell regions 40.

Next, an operation of the semiconductor device 10 will be described. Firstly, an operation of the IGBTs will be described. When a voltage by which the rear surface electrode 34 becomes a high potential side is applied between the rear surface electrode 34 and the front surface electrode 32, and a potential of the gate electrodes 26 (that is, gate potential) is raised to a threshold or greater, the IGBTs in the first IGBT region 14 and the second IGBT region 18 turn on. More specifically, when the gate potential equal to or greater than the threshold is applied, channels are generated in the body regions 54 in the vicinities of the insulating films 24. At this occasion, electrons flow from the emitter regions 52 to the collector regions 58 through the body regions 54 and the drift region 56. Further, holes flow from the collector regions 58 to the body regions 54 through the drift region 56. Due to this, current flows from the rear surface electrode 34 toward the front surface electrode 32. When the gate potential is lowered to less than the threshold, the channels disappear, and the current stops. That is, the IGBTs turn off.

Next, an operation of the diode will be described. When a voltage by which the front surface electrode 32 becomes the high potential side (hereinbelow, forward voltage) is applied between the rear surface electrode 34 and the front surface electrode 32, the diode in the diode region 16 turns on. That is, the holes flow from the anode regions 50 to the cathode region 60 through the drift region 56 as shown by solid-line arrows in FIGS. 2 and 3. Further, the electrons flow from the cathode region 60 toward the anode regions 50 through the drift region 56 (that is, they flow in an opposite direction of the solid-line arrows in FIG. 3). Due to this, the current flows from the front surface electrode 32 toward the rear surface electrode 34. Hereinbelow, the current flowing along the solid-line arrows in FIGS. 2 and 3 will be termed main current.

Further, a parasitic diode is formed by the body region 54, the drift region 56, and the cathode region 60 at a boundary of the first IGBT region 14 and the diode region 16. A parasitic diode is formed similarly at a boundary between the second IGBT region 18 and the diode region 16 as well. When the forward voltage is applied, these parasitic diodes also turn on, and the holes flow in paths indicated by dotted arrows in FIG. 2 as well. That is, the holes flow from the body regions 54 to the cathode region 60 through the drift region 56. Hereinbelow, current generated by the holes flowing in the paths shown by the dotted arrows in FIG. 2 will be termed parasitic current. Further, there are cases where the gate potential that is equal to or greater than the threshold is applied during when the diode is on. When this happens, channels are generated in the body regions 54 during the operation of the diode. If such channels are generated, a potential difference between the lower ends of the body regions 54 and the front surface electrode 32 becomes smaller. Due to this, the holes would hardly flow in the parasitic diodes, resulting in decreased parasitic current. Accordingly, the parasitic current increases and decreases according to the gate potential. Due to this, the forward voltage Vf for predetermined current to flow in the diode changes according to the gate potential. This phenomenon is called gate interference. However, in the semiconductor device 10 of the first embodiment, the forward voltage Vf is resistant to changes by the gate interference. Hereinbelow, the reason therefor will be described.

As mentioned above, in the semiconductor device 10 of the first embodiment, the interval W1 (that is, the width of the diode region 16) is 200 μm or greater. Accordingly, with wider width of the diode region 16, the area of the diode region 16 would be increased, resulting in greater amount of the main current flowing in the diode region 16. Contrary to this, the parasitic current flows only in vicinities of the boundaries between the diode region 16 and the IGBT regions 14, 18. Thus, even if the interval W1 is widened, the parasitic current would not be increased. Thus, a ratio of the parasitic current to the main current can be reduced by widening the interval W1. Accordingly, when the ratio of the parasitic current becomes smaller, the influence of the gate interference on the forward voltage Vf becomes smaller. Due to this, the forward voltage Vf is resistant to the changes by the gate interference in the semiconductor device 10.

Figure 5:
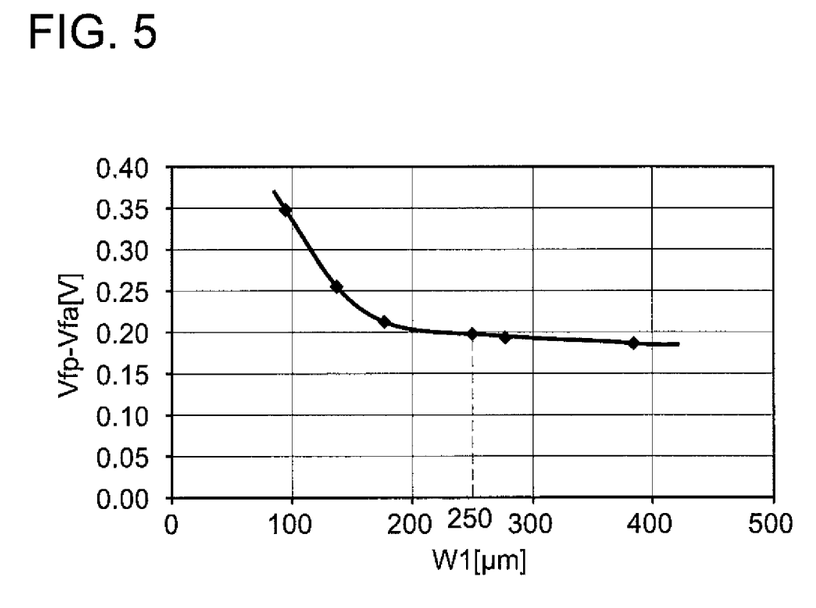
FIG. 5 is a graph showing a relationship of Vfp-Vfa and an interval W1.

FIG. 5 shows a change in a difference between the forward voltage Vfp and a forward voltage Vfa when the interval W1 is changed. Notably, the forward voltage Vfp is the forward voltage for a case of flowing current of 30A in the diode when the gate potential is equal to or greater than the threshold (when the gate interference is occurring), and the forward potential Vfa is the forward voltage for a case of flowing current of 30A in the diode when the gate potential is less than the threshold (when the gate interference is not occurring). The forward voltage Vfp is higher than the forward voltage Vfa. The influence of the gate interference is greater when the voltage difference Vfp–Vfa is larger. As can be understood from FIG. 5, the influence of the gate interference becomes more severe when the interval W1 is smaller. Further, from FIG. 5, it can also be understood that, if the interval W1 is 200 μm or greater, the voltage difference Vfp–Vfa becomes substantially constant at a low value, and the influence of the gate interference can be minimized. Since the semiconductor device 10 of the first embodiment has the interval W1 of 200 μm or greater, the forward voltage Vf is suppressed from fluctuating by the gate interference. Notably, as is apparent from FIG. 5, it is preferable to set the interval W1 to be 250 μm or greater, due to a more stabilized forward voltage Vf exhibited in such cases.

Next, a reverse recovery operation of the diode will be described. When the applied voltage to the diode is switched from the forward voltage to a reverse voltage (that is, a voltage that is oriented opposite of the forward voltage), the diode in the diode region 16 performs the reverse recovery operation. More specifically, a large number of holes is present in the drift region 56 during the forward voltage application. When the applied voltage to the diode is switched from the forward voltage to the reverse voltage, the holes in the drift region 56 are discharged to the front surface electrode 32 through the anode regions 50. Due to this, reverse current flows in the diode. The reverse current attenuates as the discharge of the holes from the drift region 56 progresses. At this occasion, if the holes are still present in the drift region 56 at a high density, the holes are not easily discharged, and an attenuation speed of the reverse current becomes slower. Due to this, a response speed of the diode becomes slower. However, in the semiconductor device 10 of the first embodiment, the reverse current in the reverse recovery operation attenuates in a short period of time. Hereinbelow, the reason therefore will be described.

As described above, in the semiconductor device 10 of the first embodiment, the contact area ratio $\Sigma S4/Sd$ of the diode region 16 is lower than each of the contact area ratio $\Sigma S2_{-1}/SI1$ of the first IGBT region 14 and the contact area ratio $\Sigma S2_{-2}/SI2$ of the second IGBT region 18. Especially, the contact area ratio S2/S1 of each cell region 42 is lower than the contact area ratio S4/S3 of each cell region 40 in the IGBT regions 14, 18. Accordingly, since the contact area ratio is low in the diode region 16, the density of the holes supplied to the drift region 56 via the contact portions 50c from the front surface electrode upon the forward voltage application becomes low. Accordingly, since the density of the holes existing in the drift region 56 upon the forward voltage application is low, the density of the holes flowing as the reverse current during the reverse recovery operation (that is, current density) is low. Thus, the reverse current attenuates in a short period of time. Due to this, in the semiconductor device 10 of the first embodiment, the response speed of the diode is fast.

As described above, in the semiconductor device 10 of the first embodiment, the main current flowing in the diode is increased while not increasing the density of the hole current flowing in the diode due to its width W1 of the diode region 16 being wide. Due to this, the influence of the parasitic current is reduced, and the instability of the forward voltage due to the gate interference can be suppressed. Further, in the semiconductor device 10 of the first embodiment, the density of the hole current flowing in the diode is low due to the contact area ratio of the diode region 16 being low, and a satisfactory response speed for the diode is thereby facilitated.

Notably, in the aforementioned embodiment, the boundary between the cathode region 60 and the collector region 58 matches the boundary between the diode region 16 and the first IGBT region 14, and the boundary between the cathode region 60 and the collector region 62 matches the boundary between the diode region 16 and the second IGBT region 18. However, they do not necessarily need to be provided as aforementioned, and positions of the respective boundaries may be offset on front surface 12a side or the rear surface 12b side. The cathode region 60 simply needs to be provided at least in part of the diode region 16, the collector region 58 simply needs to be provided at least in part of the first IGBT region 14, and the collector region 62 simply needs to be provided at least in part of the second IGBT region 18.

Further, in the aforementioned first embodiment, the potential of the gate electrodes 26 are configured controllable independent from the potential of the control electrodes 28. However, both of the gate electrodes 26 and the control electrodes 28 may be connected to gate pads. Further, the control electrodes 28 may not be provided inside the trenches 22d in the diode region 16, and the trenches 22d may be filled by insulating layers. Further, the gate electrodes 26 may not be provided in the trenches 22c, 22e at the boundaries, and the trenches 22c, 22e may be filled by insulating layers.

Further, the respective anode regions 50 may be separated from each other by trenches 22, or may be connected to each other at a portion that is not shown. Further, the respective body regions 54 may be separated from each other by the trenches 22, or may be connected to each other at a portion that is not shown. Further, the anode regions 50 and the body regions 54 may be separated from each other by the trenches 22, or may be connected to each other at a portion that is not shown.

Further, in the aforementioned first embodiment, one diode region 16 and two IGBT regions 14, 18 are provided in the semiconductor substrate 12. However, in the plan view of the front surface of the semiconductor substrate, a plurality of diode regions and a plurality of IGBT regions may be provided alternately. In such case as well, the width of the diode region interposed between two IGBT regions may be set to 200 μm or greater, and the contact ratio of the diode region may be set lower than the contact area ratios of the adjacent two IGBT regions, as a result of which similar effects as those of the first embodiment can be achieved.

Corresponding relationships of the constituent features of the semiconductor device of the first embodiment and the constituent features of the claims will be described. The trench 22c in the first embodiment is an example of a first boundary trench in claims, the trench 22a in the first embodiment is an example of a first trench in claims, the trench 22e in the first embodiment is an example of a second boundary trench in claims, the trench 22g in the first embodiment is an example of a second trench in claims, the drift region 56 and the cathode region 60 in the first embodiment are examples of an n-type region in claims, the trench 22d in the first embodiment is an example of a third trench in claims, the cell regions 42 in the first embodiment are examples of a diode cell region in claims, the trenches 22b, 22f in the first embodiment are examples of a fourth trench in claims, and the cell regions 40 in the first embodiment are examples of an IGBT cell region in claims.

Second Embodiment

Figure 6:
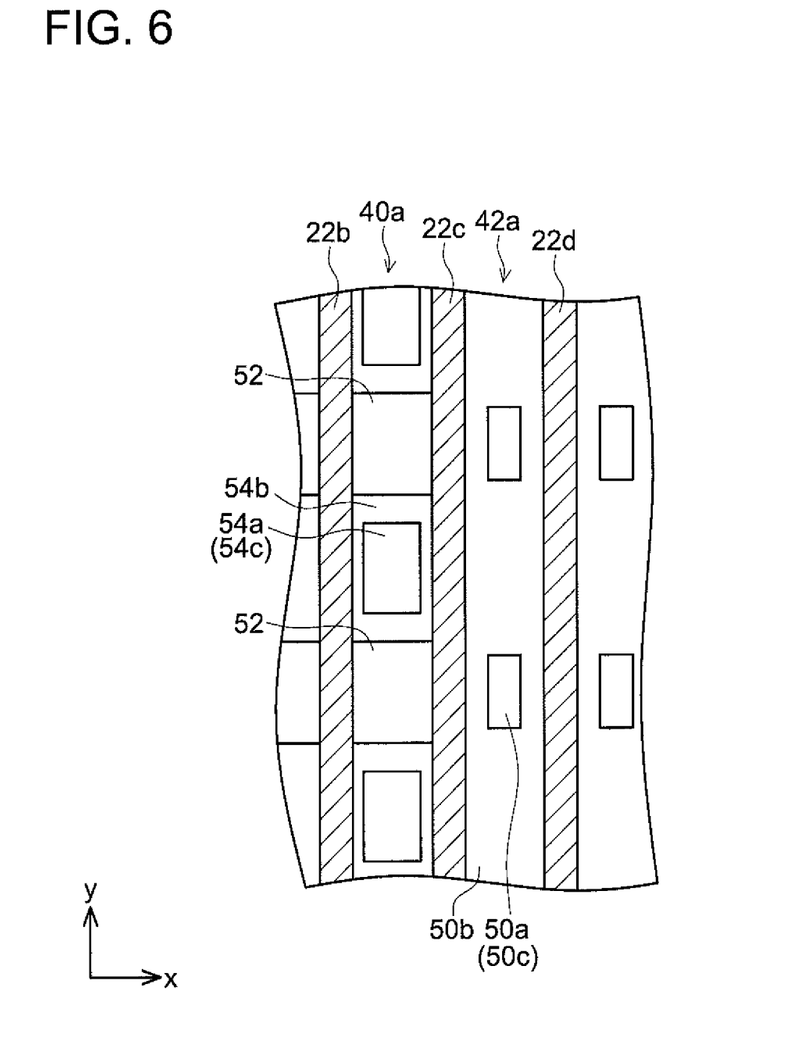
FIG. 6 is an enlarged plan view of a semiconductor substrate 10 near a trench 22c of a second embodiment.

As shown in FIG. 6, a semiconductor device of a second embodiment includes a plurality of high density regions 50a in each cell region 42. That is, a plurality of contact portions 50c is provided in each cell region 42. In this cell region 42, the plurality of contact portions 50c is arranged in a line along the y direction. Further, each of the contact portions 50c is arranged at a position in the x direction relative to its corresponding emitter region 52. Other configurations of the semiconductor device of the second embodiment are equal to those of the semiconductor device of the first embodiment. Even with the configuration of the second embodiment, the contact area ratio of the diode region 16 is smaller than the contact area ratio of each IGBT regions 14, 18. Thus, a response speed of the diode is fast. Further, since the width W1 of the diode region 16 is 200 μm or greater, the instability of the forward voltage caused by the gate interference is suppressed. Further, according to this configuration, the area ratios of the contact portions 50c can be reduced by widening intervals between the respective contact portions 50c. Due to this, the area ratios of the contact portions 50c can be reduced without making width of the contact portions 50c smaller. Further, since the respective contact portions 50c are arranged at the positions in the x direction as seen from the emitter regions 52, the holes existing in the drift region 56 on the rear surface side of the emitter regions 52 are discharged to the front surface electrode by moving through the contact portions 50c in the diode region 16 when the IGBTs turn off. Thus, accordingly, a satisfactory switching speed of the IGBTs can be facilitated by arranging the contact portions 50c at the positions in the x direction relative to the emitter regions 52.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. A semiconductor device, comprising:
a semiconductor substrate;
a front surface electrode provided on a front surface of the semiconductor substrate; and
a rear surface electrode provided on a rear surface of the semiconductor substrate,
wherein
a first boundary trench, a first trench, a second boundary trench, and a second trench are provided in the front surface, the first trench extends along the first boundary trench, the second boundary trench is provided on a side opposite to the first trench with the first boundary trench interposed in between the second boundary trench and the first trench, and extends along the first boundary trench, and the second trench is provided on a side opposite to the first boundary trench with the second boundary trench interposed in between the second trench and the first boundary trench, and extends along the first boundary trench,
the semiconductor substrate comprises a first IGBT region, a diode region, and a second IGBT region, the first IGBT region is located between the first trench and the first boundary trench, the diode region is located between the first boundary trench and the second boundary trench, and the second IGBT region is located between the second trench and the second boundary trench,
a gate insulating film and a gate electrode insulated from the semiconductor substrate by the gate insulating film are provided in each of the first trench and the second trench,
an interlayer insulating film is each provided between each of the gate electrodes and the front surface electrode,
an insulating layer is provided in each of the first boundary trench and the second boundary trench,
an emitter region and a body region are provided in each of the first IGBT region and the second IGBT region, each of the emitter regions is of n-type and in contact with the front surface electrode and the corresponding gate insulating film, and each of the body regions is of p-type, in contact with the front surface electrode, and in contact with the corresponding gate insulating film on a rear surface side of the emitter region,
each of the body regions comprises a body contact portion being in contact with the front surface electrode and having a p-type impurity density equal to or higher than $1 \times 10^{18}$ atoms/cm$^3$ at the front surface,
an anode region of p-type being in contact with the front surface electrode is provided in the diode region,
the anode region comprises an anode contact portion being in contact with the front surface electrode and having a p-type impurity density equal to or higher than $1 \times 10^{18}$ atoms/cm$^3$ at the front surface,
an n-type region extending across the first IGBT region, the second IGBT region and the diode region is provided in a region located on rear surface sides of the anode region and each of the body regions,
the n-type region is in contact with the rear surface electrode in at least a part of the diode region,
a collector region of p-type being in contact with the rear surface electrode is provided each of at least a part of a region located on a rear surface side of the n-type region in the first IGBT region and at least a part of a region located on a rear surface side of the n-type region in the second IGBT region,
an interval between the first boundary trench and the second boundary trench is equal to or longer than 200 μm, and
an area ratio of the anode contact portion occupying the front surface in the diode region is lower than each of an area ratio of the body contact portion occupying the front surface in the first IGBT region and an area ratio of the body contact portion occupying the front surface in the second IGBT region.

2. The semiconductor device of claim 1, wherein
a plurality of third trenches extending along the first boundary trench is provided in the front surface in the diode region,
regions interposed in between any two of the third trenches, the first boundary trench, and the second boundary trench are diode cell regions, and
the anode region comprising the anode contact portion is provided in each of the diode cell regions.

3. The semiconductor device of claim 2, wherein
a plurality of fourth trenches extending along the first boundary trench is provided in each of the first IGBT region and the second IGBT region,
the gate insulating film and the gate electrode are provided in each of the fourth trenches, and
the emitter region and the body region comprising the body contact portion are provided in each of IGBT cell regions, and each of the IGBT cell regions is interposed in between any two of the fourth trenches, the first boundary trench, and the second boundary trench.

4. The semiconductor device of claim 3, wherein in each of the diode cell regions, an area ratio of the anode contact portion occupying the front surface in the diode cell region is lower than each of area ratios of the body contact portions occupying the front surface in the IGBT cell regions.

5. The semiconductor device of claim 2, wherein the anode contact portion provided in each of the diode cell regions extends along the third trenches.

6. The semiconductor device of claim 2, wherein
each of the diode cell regions comprises plural parts of the anode contact portion separated from each other, and
the plural parts of the anode contact portion are arranged along the third trenches in each of the diode cell regions.

7. The semiconductor device of claim 6, wherein each of the plural parts of the anode contact portion provided in the diode cell region adjacent to the first boundary trench is arranged at a position in a width direction of the first boundary trench as seen from the emitter region provided in the IGBT cell region adjacent to the first boundary trench.

* * * * *